(12) United States Patent
Kim et al.

(10) Patent No.: US 9,651,431 B2
(45) Date of Patent: May 16, 2017

(54) SEMICONDUCTOR PACKAGE AND METHOD OF ESTIMATING SURFACE TEMPERATURE OF SEMICONDUCTOR DEVICE INCLUDING THE SAME

(71) Applicant: SAMSUNG ELECTRONICS CO., LTD., Suwon-si (KR)

(72) Inventors: Jae Choon Kim, Hwasung (KR); Jichul Kim, Hwasung (KR); Jin-Kwon Bae, Hwasung (KR); Eunho Jung, Hwasung (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 644 days.

(21) Appl. No.: 14/136,787

(22) Filed: Dec. 20, 2013

(65) Prior Publication Data

US 2014/0247859 A1  Sep. 4, 2014

(30) Foreign Application Priority Data

Mar. 4, 2013 (KR) .................. 10-2013-0022847

(51) Int. Cl.
*G01K 7/42* (2006.01)
*G01K 3/06* (2006.01)

(52) U.S. Cl.
CPC ................. *G01K 7/42* (2013.01); *G01K 3/06* (2013.01); *H01L 2224/16225* (2013.01); *H01L 2224/48091* (2013.01); *H01L 2224/73265* (2013.01); *H01L 2924/15311* (2013.01)

(58) Field of Classification Search
CPC ............ G01K 7/42; G01K 7/425; G01K 3/06
See application file for complete search history.

(56) References Cited

U.S. PATENT DOCUMENTS

| 4,848,090 A | * | 7/1989 | Peters ..................... F25B 21/02 |
| | | | 165/253 |
| 7,173,802 B2 | | 2/2007 | Hisada et al. |
| 7,871,848 B2 | | 1/2011 | Lee |
| 2005/0105233 A1 | | 5/2005 | Hisada et al. |
| 2008/0169860 A1 | | 7/2008 | Song |
| 2009/0140369 A1 | | 6/2009 | Lee |
| 2009/0285261 A1 | * | 11/2009 | Casey .................... G01K 7/015 |
| | | | 374/178 |
| 2010/0139389 A1 | | 6/2010 | Morita et al. |

(Continued)

FOREIGN PATENT DOCUMENTS

| JP | 2004-063716 A | 2/2004 |
| JP | 2004-241405 A | 8/2004 |

(Continued)

*Primary Examiner* — Manuel L Barbee
(74) *Attorney, Agent, or Firm* — Sughrue Mion, PLLC

(57) ABSTRACT

A semiconductor package includes a first package including a first substrate and a first semiconductor chip mounted on the first substrate and a second package facing and spaced apart from the first package. The second package includes a second substrate on which a second semiconductor chip is mounted. The semiconductor package also includes a connection structure electrically connecting the first and second packages to each other, a first temperature sensor connected to the first substrate, a second temperature sensor connected to the first semiconductor chip, and a third temperature sensor connected to the second semiconductor chip.

14 Claims, 6 Drawing Sheets

(56) References Cited

U.S. PATENT DOCUMENTS

| | | |
|---|---|---|
| 2012/0133427 A1 | 5/2012 | Kim et al. |
| 2012/0163413 A1* | 6/2012 | Kim .................. G01K 7/01 |
| | | 374/152 |
| 2013/0166093 A1 | 6/2013 | Kim et al. |
| 2013/0321041 A1 | 12/2013 | Kim et al. |

FOREIGN PATENT DOCUMENTS

| | | |
|---|---|---|
| JP | 2006-133028 A | 5/2006 |
| JP | 2010-091443 A | 4/2010 |
| JP | 2011-253971 A | 12/2011 |
| JP | 2012-114446 A | 6/2012 |
| KR | 10-0949877 B1 | 3/2010 |
| KR | 10-1234990 B1 | 2/2013 |

* cited by examiner

SEMICONDUCTOR PACKAGE AND METHOD OF ESTIMATING SURFACE TEMPERATURE OF SEMICONDUCTOR DEVICE INCLUDING THE SAME

CROSS-REFERENCE TO RELATED APPLICATIONS

This U.S. non-provisional patent application claims priority under 35 U.S.C. §119 to Korean Patent Application No. 10-2013-0022847, filed on Mar. 4, 2013, the entirety of which is incorporated herein by reference.

BACKGROUND

Apparatuses and methods consistent with exemplary embodiments of the inventive concept relate to a semiconductor package and a method of estimating a surface temperature of a semiconductor device including the same and, more particularly, to a package-on-package (PoP) and a method of estimating a surface temperature of a semiconductor device including the same.

Semiconductor devices have become increasingly integrated with the development of the electronics industry. Various problems (e.g., margin decrease of an exposure process) may occur, such that it may be increasingly difficult to manufacture semiconductor devices. Additionally, high speed semiconductor devices have been increasingly demanded with the development of the electronics industry. Research has been conducted for satisfying the demands for highly integrated and/or high speed semiconductor devices.

SUMMARY

One or more exemplary embodiments of the inventive concept provide highly integrated and high speed semiconductor packages.

One or more exemplary embodiments of the inventive concept also provide methods of estimating a surface temperature of a semiconductor device including the semiconductor package.

According to an aspect of an exemplary embodiment, there is provided a semiconductor package which may include: a first package including a first substrate on which a first semiconductor chip is mounted; a second package facing and spaced apart from the first package, the second package including a second substrate on which a second semiconductor chip is mounted; a connection structure electrically connecting the first and second packages to each other; a first temperature sensor connected to the first substrate; a second temperature sensor connected to the first semiconductor chip; and a third temperature sensor connected to the second semiconductor chip.

Each of the first, second and third temperature sensors may include a thermistor.

Each of the first, second and third temperature sensors may include a resistor.

The first semiconductor chip may include logic cells; and the second semiconductor chip may include memory cells.

A temperature of the first semiconductor chip may be higher than a temperature of the second semiconductor chip in operation.

According to an aspect of another exemplary embodiment, there is provided a method of estimating a surface temperature of a semiconductor device including a semiconductor package which may include: measuring temperatures of a lower portion, an intermediate portion, and an upper portion of the semiconductor package by first, second, and third temperature sensors respectively connected to the lower, intermediate, and the upper portions of the semiconductor package; calculating a first thermal resistance of a portion of the semiconductor package between the first and second temperature sensors and a second thermal resistance of a portion of the semiconductor package between the second and third temperature sensors; calculating first energy consumed from the intermediate portion to the upper portion of the semiconductor package and second energy consumed from the intermediate portion to the lower portion of the semiconductor package using the measured temperatures and the calculated first and second thermal resistances; and estimating temperatures of a top surface and a bottom surface of the semiconductor device using the calculated first and second energies.

The first and second thermal resistances of the semiconductor packages may be values obtained from a structure and materials constituting the semiconductor package.

The semiconductor device may further include: a housing surrounding the semiconductor package. Estimating the temperatures of the top surface and the bottom surface of the semiconductor device may include: calculating a first combined thermal resistance between the second temperature sensor and a top surface of an upper portion of the housing and a second combined thermal resistance between the second temperature sensor and a bottom surface of a lower upper portion of the housing.

The first and second combined thermal resistances of the semiconductor device may be values obtained by structures and materials constituting the semiconductor device between the second temperature sensor and the top surface of the upper portion of the housing and between the second temperature sensor and the bottom surface of the lower portion of the housing.

BRIEF DESCRIPTION OF THE DRAWINGS

The inventive concept will become more apparent in view of the attached drawings and accompanying detailed description, in which.

DETAILED DESCRIPTION OF THE EXEMPLARY EMBODIMENTS

Figure 1:
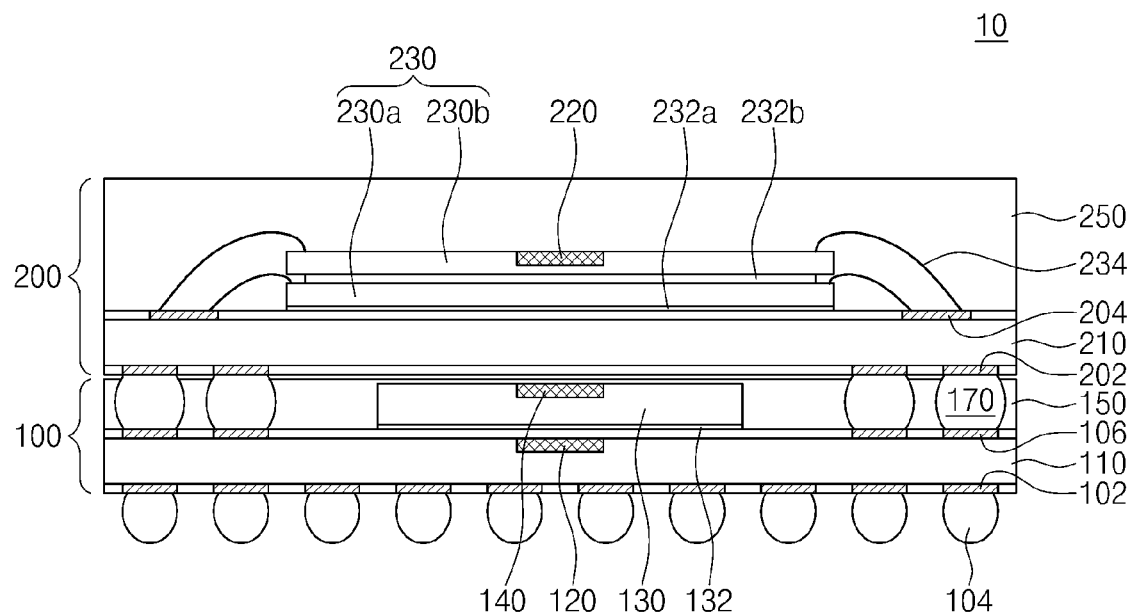
FIG. 1 is a cross-sectional view illustrating a semiconductor package according to an exemplary embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, the exemplary embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the exemplary embodiment in the detailed description will be described with sectional views as exemplary views of the inventive concept. Accordingly, shapes of the exemplary views may be modified according to manufacturing techniques and/or allowable errors. Therefore, the exemplary embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. The exemplary embodiments of the present inventive concept explained and illustrated herein include their complementary counterparts. The same reference numerals or the same reference designators denote the same elements throughout the specification.

Moreover, the exemplary embodiments are described herein with reference to cross-sectional illustrations and/or plane illustrations that are some exemplary illustrations. Accordingly, variations from the shapes of the illustrations as a result, for example, of manufacturing techniques and/or tolerances, are to be expected. Thus, the exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the example embodiments.

FIG. 1 is a cross-sectional view illustrating a semiconductor package according to an exemplary embodiment of the inventive concept.

Referring to FIG. 1, a semiconductor package 10 may include a first package 100, a second package 200 and a connection structure 170 electrically connecting the first and second packages 100 and 200 to each other.

The first package 100 may include a first substrate 110, a first semiconductor chip 130, a first temperature sensor 120, a second temperature sensor 140 and a first mold part 150.

The first substrate 110 may be a printed circuit board (PCB). The first substrate 110 may include a first surface and a second surface opposite to the first surface. The first semiconductor chip 130 may be mounted on the first surface of the first substrate 110. External terminals 104 may be electrically connected to the second surface of the first substrate 110.

The first semiconductor chip 130 may adhere to the first surface of the first substrate 110 by a die adhesive film (DAF) 132. The first semiconductor chip 130 may include logic cells. First pads 106 may be disposed to be adjacent to the first semiconductor chip 130 on the first surface of the first substrate 110. The first pads 106 may be electrically connected to the connection structure 170.

Second pads 102 electrically connected to the external terminals 104 may be disposed on the second surface of the first substrate 110. Each of the external terminals 104 may be a solder ball.

The first temperature sensor 120 may be connected to the first substrate 110 to sense a temperature of a lower portion of the semiconductor package 10. According to an exemplary embodiment, the first temperature sensor 120 may be disposed in the first substrate 110. According to an exemplary embodiment, the first temperature sensor 120 may include a resistor. According to an exemplary embodiment, the first temperature sensor 120 may include a thermistor.

The second temperature sensor 140 may be connected to the first semiconductor chip 130 to sense a temperature of an intermediate portion of the semiconductor package 10. According to an exemplary embodiment, the second temperature sensor 140 may be disposed in the first semiconductor chip 130. According to an exemplary embodiment, the second temperature sensor 140 may include a resistor. According to an exemplary embodiment, the second temperature sensor 140 may include a thermistor.

The first mold part 150 may be disposed to completely cover the first substrate 110 and the first semiconductor chip 130. In more detail, the first mold part 150 may completely cover a top surface of the first semiconductor chip 130.

The second package 200 may include a second substrate 210, a second semiconductor chip 230, a third temperature sensor 220 and a second mold part 250.

The second substrate 210 may include a first surface and a second surface opposite to the first surface. The second semiconductor chip 230 may be mounted on the first surface of the second substrate 210.

The second semiconductor chip 230 may adhere to the first surface of the second substrate 210 by a DAF 232a. The second semiconductor chip 230 may include a plurality of second semiconductor chips 230a and 230b. The second semiconductor chips 230a and 230b may be vertically stacked. The plurality of second semiconductor chips 230a and 230b may adhere to each other by a DAF 232b. The plurality of second semiconductor chips 230a and 230b may include memory cells. When the semiconductor package 10 is operated, the amount of heat generated from the second semiconductor chips 230a and 230b including the memory cells may be less than the amount of heat generated from the first semiconductor chip 130 including the logic cells. That is, a temperature of the first semiconductor chip 130 may be higher than a temperature of each of the second semiconductor chips 230a and 230b.

First pads 204 may be disposed to be adjacent to the second semiconductor chip 230 on the first surface of the second substrate 210. The first pads 204 may be electrically connected to each of the second semiconductor chips 230a and 230b through bonding wires 234.

Second pads 202 electrically connected to the connection structure 170 may be disposed on the second surface of the second substrate 210.

The third temperature sensor 220 may be connected to the second semiconductor chip 230 to sensor a temperature of an upper portion of the semiconductor package 10. According to an exemplary embodiment, if the plurality of second semiconductor chips 230a and 230b are included in the second package 200, the third temperature sensor 220 may be disposed on the uppermost one of the second semiconductor chips 230a and 230b. Alternatively, the third temperature sensor 220 may be disposed on the uppermost second semiconductor chip 230b of the second semiconductor chips 230a and 230b. According to an exemplary embodiment, the third temperature sensor 220 may include a resistor. In another example, the third temperature sensor 220 may include a thermistor.

The second mold part 250 may completely cover the second substrate 210, the second semiconductor chip 230 and the third temperature sensor 220.

The connection structure 170 may be disposed between the first and second packages 100 and 200 facing and spaced apart from each other. The connection structure 170 may be in contact with the first pad 106 of the first substrate 110 and the second pad 202 of the second substrate and may electrically connect the first and second packages 100 and 200 to each other. For example, the connection structure 170 may be a solder ball.

According to an exemplary embodiment, temperatures of spots of the lower, intermediate and upper portions of the semiconductor package 10 may be sensed by the first, second and third temperature sensors 120, 140 and 220. Thus, it is possible to improve reliability to a temperature variation in the semiconductor package 10.

Hereinafter, modified examples of the semiconductor package 10 will be described briefly. In the modified examples, the descriptions to the same elements as described with reference to FIG. 1 will be omitted for the purpose of ease and convenience in explanation.

Figure 2:
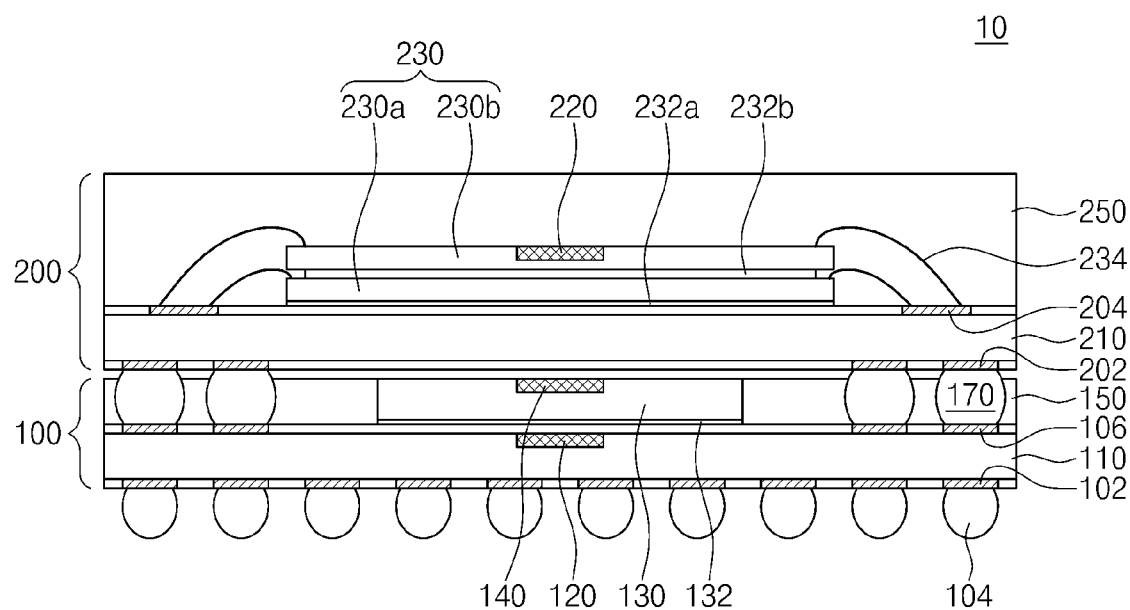
FIGS. 2 and 3 are cross-sectional views illustrating semiconductor packages according to exemplary embodiments of the inventive concept.
Figure 3:
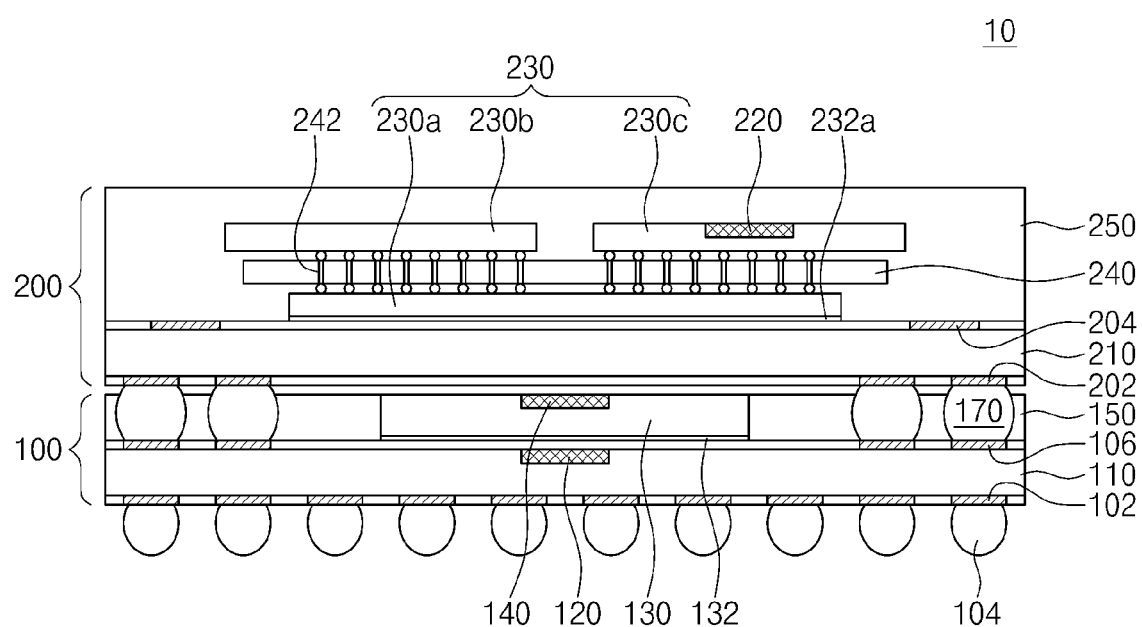

FIGS. 2 and 3 are cross-sectional views illustrating semiconductor packages according to exemplary embodiment of the inventive concept.

According to an exemplary embodiment of FIG. 2, a first mold part 150 of the first package 100 may have an exposed molding underfill (e-MUF) structure. The first mold part 150 may cover a sidewall of the first semiconductor chip 130. However, the first mold part 150 may expose the top surface of the first semiconductor chip 130.

According to an exemplary embodiment of FIG. 3, the second package 200 may further include an interposer 240. A second semiconductor chip 230 may be electrically connected to the inter poser 240. According to an exemplary embodiment, a plurality of second semiconductor chips 230a, 230b, and 230c may be electrically connected to one another through through-silicon-vias (TSVs) 242.

[Semiconductor Device]

Figure 4:
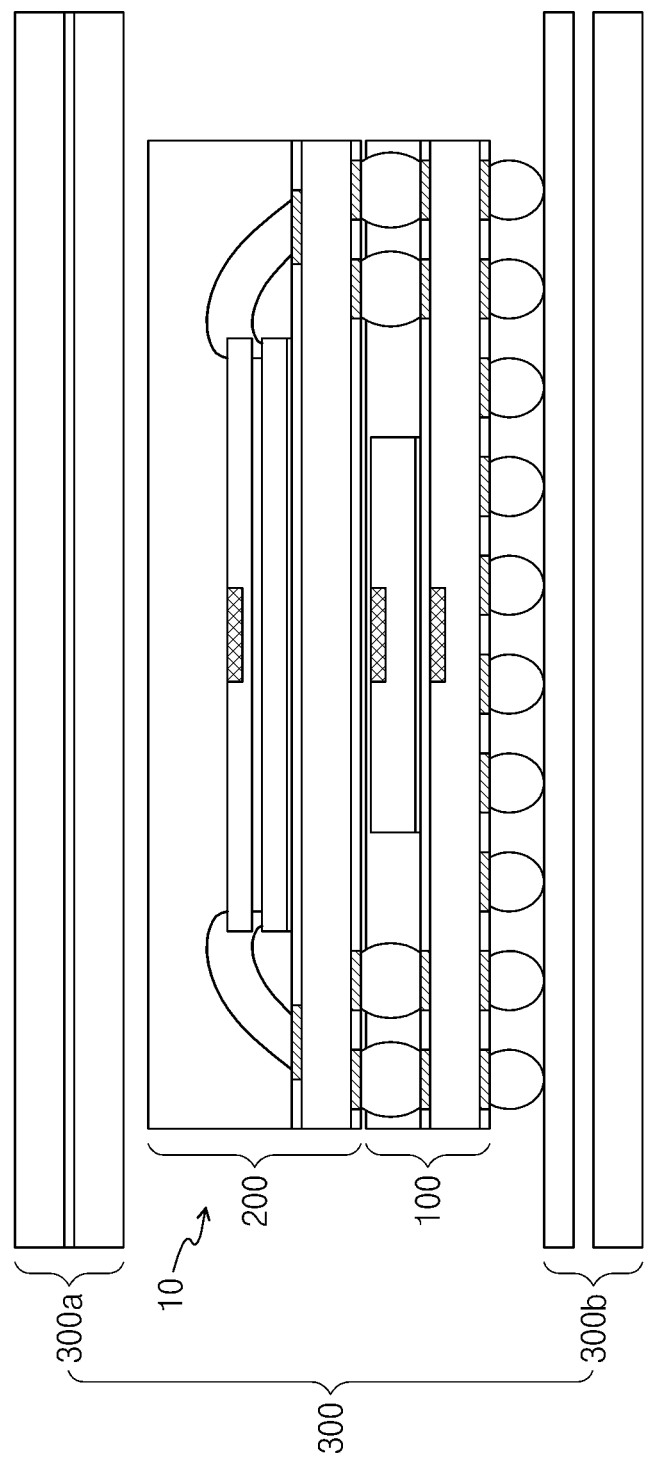
FIG. 4 is a cross-sectional view illustrating a semiconductor device including a semiconductor package according to an exemplary embodiment of the inventive concept.

FIG. 4 is a cross-sectional view illustrating a semiconductor device including a semiconductor package according to an exemplary embodiment of the inventive concept.

Referring to FIG. 4, a semiconductor device may include a semiconductor package 10 and a housing 300 protecting the semiconductor package 10. According to an exemplary embodiment, the semiconductor device may be a smart phone or a tablet personal computer.

The semiconductor package 10 may be at least one of the semiconductor packages 10 described with reference to FIGS. 1 to 3. The housing 300 may surround the semiconductor package 10. According to an exemplary embodiment, the housing 300 may be spaced apart from the semiconductor package 10. According to an exemplary embodiment, the housing 300 may be in contact with the semiconductor package 10. The housing 300 may include an upper housing 300a and a lower housing 300b. Thermal resistance values of the upper and lower housings 300a and 300b may be measurable by a structure and constitutive materials of the housing 300.

Figure 5:
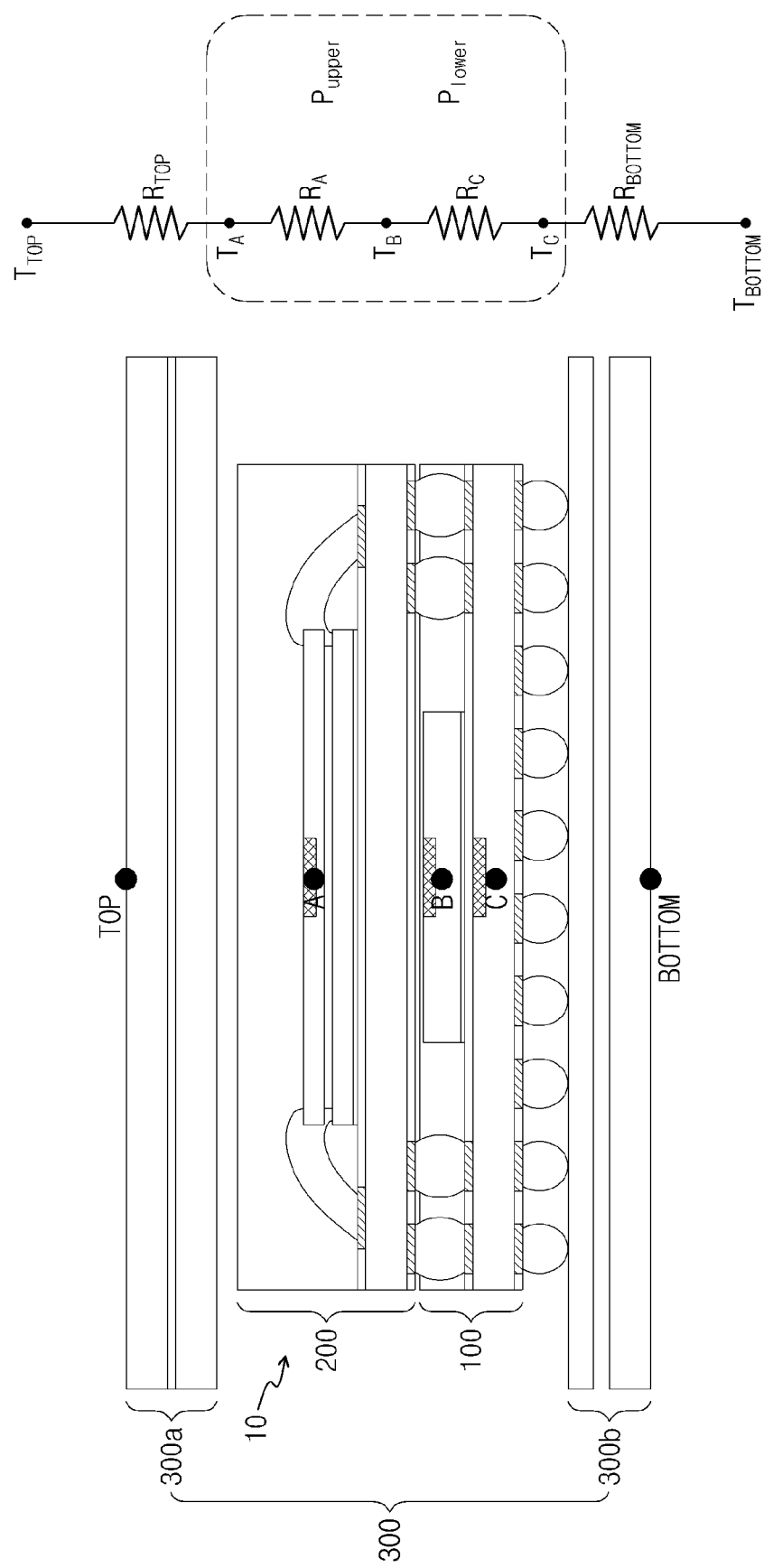
FIG. 5 is a cross-sectional view illustrating a method of estimating a surface temperature of a semiconductor device according to an exemplary embodiment of the inventive concept.
Figure 6:
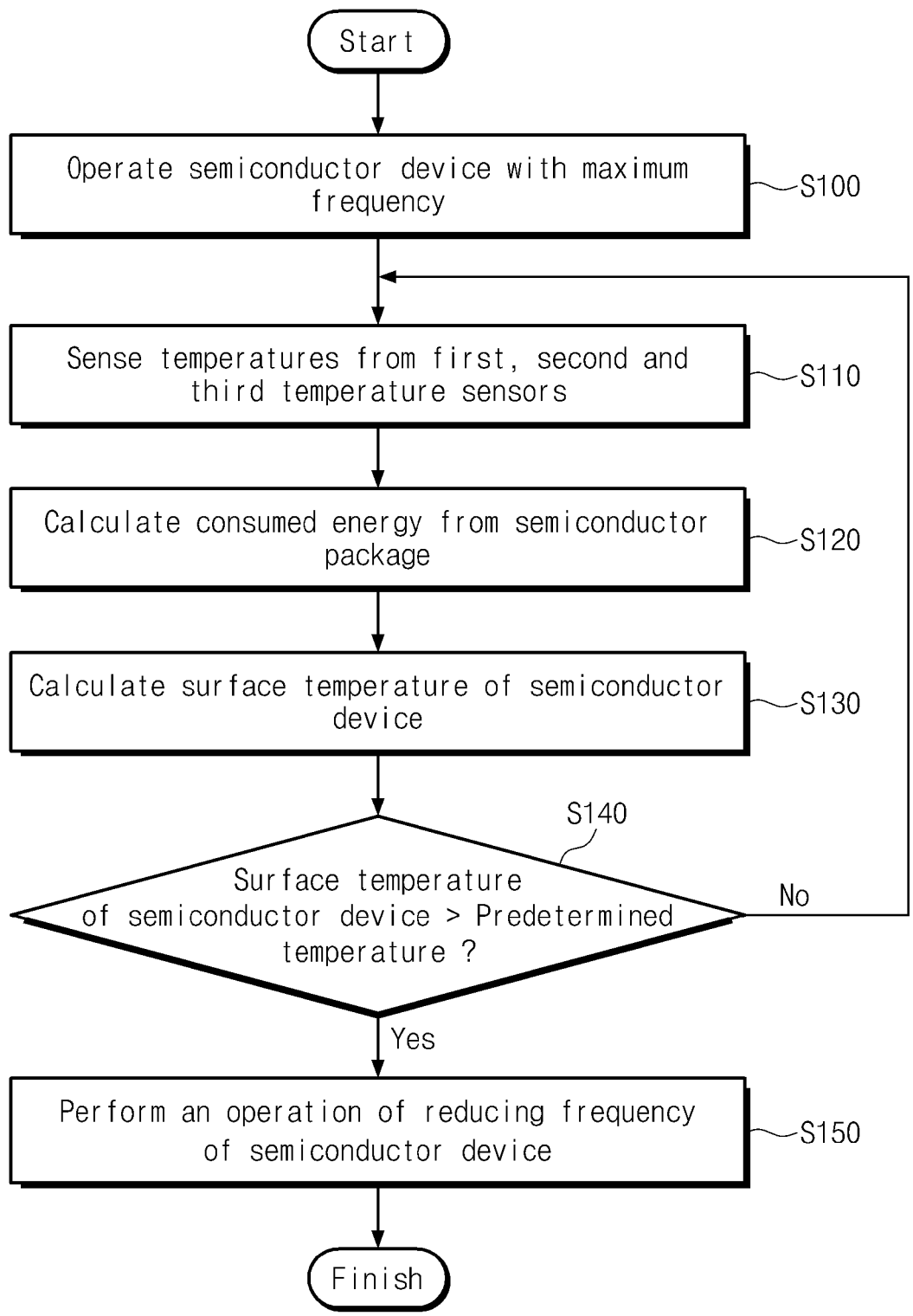
FIG. 6 is a flowchart illustrating a method of estimating a surface temperature of a semiconductor device according to an exemplary embodiment of the inventive concept.

FIG. 5 is a cross-sectional view illustrating a method of estimating a surface temperature of a semiconductor device according to an exemplary embodiment of the inventive concept. FIG. 6 is a flowchart illustrating a method of estimating a surface temperature of a semiconductor device according to an exemplary embodiment of the inventive concept.

Referring to FIGS. 5 and 6, the semiconductor device is operated with a maximum frequency (S100).

In the state that the semiconductor device is operated with the maximum frequency, temperatures $T_C$, $T_B$ and $T_A$ of spots of the lower, intermediate and upper portions of the semiconductor package 10 are sensed from the first, second and third temperature sensors 120, 140 and 220 of FIG. 1, respectively (S110).

A thermal resistance $R_C$ of a portion (e.g., the first package 100) of the semiconductor package 10 between the first and second temperature sensors 120 and 140 may be measured. Additionally, a thermal resistance $R_A$ of a portion (e.g., the second package 200) of the semiconductor package 10 between the second and third temperature sensors 140 and 220 may also be measured. The thermal resistances $R_C$ and $R_A$ are values calculated from the structure and the materials constituting the semiconductor packages 10.

Energy $P_{lower}$ consumed from the intermediate portion to the lower portion of the semiconductor package 10 and energy $P_{upper}$ consumed from the intermediate portion to the upper portion of the semiconductor package 10 are obtained using the temperatures $T_A$, $T_B$ and $T_C$ and the thermal resistances $R_A$ and $R_C$ of the semiconductor package 10 (S120).

For example, the temperature $T_B$ of 70° C. may be sensed from the second temperature sensor (the intermediate portion), the temperature $T_C$ of 62° C. may be sensed from the first temperature sensor (the lower portion), and the heat resistance $R_C$ of the first package 100 may be 2° C./W. In this case, a temperature difference between the intermediate and lower portions of the semiconductor package 10 is about 8° C. Thus, it may be estimated that the energy $P_{lower}$ about 4

W is consumed in a vertical down direction from the intermediate portion to the lower portion of the semiconductor package 10. Additionally, if the temperature $T_A$ of 64° C. is sensed from the third temperature sensor (the upper portion) and the heat resistance $R_A$ of the second package 200 is 2° C./W, a temperature difference between the intermediate and upper portions of the semiconductor package 10 is about 6° C. Thus, it may be estimated that the energy $P_{upper}$ of about 3 W is consumed in a vertical up direction from the intermediate portion to the upper portion of the semiconductor package 10.

Surface temperatures $T_{TOP}$ and $T_{BOTTOM}$ may be estimated using the obtained energies $P_{lower}$ and $P_{upper}$ consumed from the intermediate portion to the lower portion and from the intermediate portion to the upper portion of the semiconductor package 10 (S130).

The energy $P_{lower}$ of about 4 W is consumed in the vertical down direction when the temperature $T_B$ of the spot of the intermediate of the semiconductor package 10 is 70° C. in the example described above. A combined thermal resistance of the first package 100 and the lower housing 300b is a value obtained from structures and materials constituting the first package 100 and the lower housing 300b. The combined thermal resistance of the first package 100 and the lower housing 300b may substantially correspond to a thermal resistance between the second temperature sensor and a bottom surface of the lower housing 300b. If the combined thermal resistance of the first package 100 and the lower housing 300b is 10° C./W, a temperature $T_{BOTTOM}$ of a surface of the lower housing 300b may be estimated at about 30° C. On the other hand, the energy $P_{upper}$ of about 3 W is consumed in the vertical up direction when the temperature $T_B$ of the spot of the intermediate of the semiconductor package 10 is 70° C. in the example described above. A combined thermal resistance of the second package 200 and the upper housing 300a is a value obtained from structures and materials constituting the second package 200 and the upper housing 300a. The combined thermal resistance of the second package 200 and the upper housing 300a may substantially correspond to a thermal resistance between the second temperature sensor and a top surface of the upper housing 300a. If the combined thermal resistance of the second package 200 and the upper housing 300a is 10° C./W, a temperature $T_{TOP}$ of a surface of the upper housing 300a may be estimated at about 40° C. In FIG. 5, reference designators "$R_{BOTTOM}$" and "$R_{TOP}$" may indicate a thermal resistance of the lower housing 300b and a thermal resistance of the upper housing 300a, respectively.

The estimated surface temperatures $T_{TOP}$ and $T_{BOTTOM}$ of the semiconductor device are compared with a predetermined temperature (S140). If the estimated surface temperatures $T_{TOP}$ and $T_{BOTTOM}$ of the semiconductor device exist in a predetermined temperature range, the semiconductor device is continuously operated. On the contrary, if the estimated surface temperatures $T_{TOP}$ and $T_{BOTTOM}$ of the semiconductor device are out of the predetermined temperature range, the semiconductor device may perform an operation of reducing a frequency (S150).

The steps S110, S120, S130 and S140 may be repeated to continuously monitor the surface temperatures of the semiconductor device.

It is possible to estimate a transient temperature of the surface of the semiconductor device according to a temperature of an external environment and a surface temperature of the semiconductor device according to a time.

Figure 7:
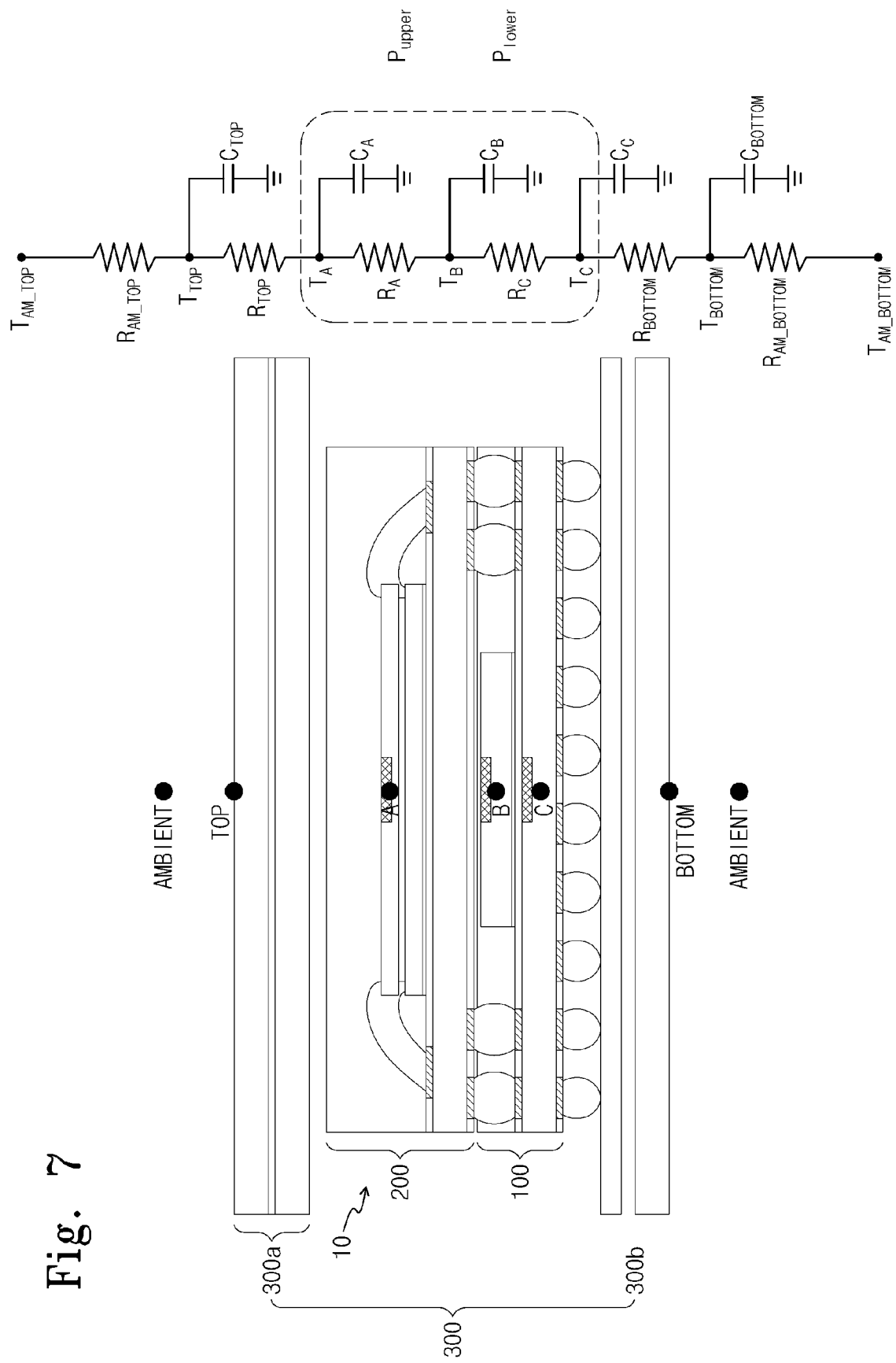
FIG. 7 is a cross-sectional view illustrating a method of estimating a transient temperature of a surface of a semiconductor device according to an exemplary embodiment of the inventive concept.

FIG. 7 is a cross-sectional view illustrating a method of estimating a transient temperature of a surface of a semiconductor device according to an exemplary embodiment of the inventive concept.

Referring to FIGS. 5 and 7, after the semiconductor device is operated with the maximum frequency, the temperatures $T_A$, $T_B$, and $T_C$ of the upper, intermediate and lower portions are sensed from the first, second and third temperature sensors (See 120, 140, and 220 of FIG. 1) of the semiconductor package 10. The thermal resistances $R_A$ and $R_C$ of the semiconductor package 10 and thermal capacitances $C_A$, $C_B$ and $C_C$ of upper, intermediate and lower portions of the semiconductor packages 10 may be calculated from the structure and materials constituting the semiconductor package 10. The energies $P_{lower}$ and $P_{upper}$ consumed from the intermediate portion to the lower portion and from the intermediate portion to the upper portion may be obtained using the temperatures $T_A$, $T_B$ and $T_C$ and the thermal resistances $R_A$ and $R_C$ of the semiconductor package 10 by the following equation 1.

$$P_{upper}(t) = \frac{T_B(t) - T_A(t)}{R_A + R_{TOP} \times \left\{1 - \exp\left(-\frac{t}{\tau_{die}}\right)\right\}} \quad \text{[Equation 1]}$$

The equation 1 is an equation calculating the energy $P_{upper}$ consumed from the intermediate portion to the upper portion of the semiconductor package 10. The energy $P_{lower}$ consumed from the intermediate portion to the lower portion of the semiconductor package 10 may be calculated by the same method as the energy $P_{upper}$. In the equation 1, "$P_{upper}$" denotes the energy consumed from the intermediate portion to the upper portion of the semiconductor package 10, "$R_A$" denotes the thermal resistance of an upper portion between the second and third temperature sensors of the semiconductor package 10, "$R_{TOP}$" denotes the thermal resistance of an upper portion (e.g., the upper housing 300a) of the semiconductor device, "$T_B$" denotes the temperature of the intermediate portion of the semiconductor package 10, and "$T_A$" denotes the temperature of the upper portion of the semiconductor package 10. In the equation 1, "$\tau_{die}$" denotes a torque in the semiconductor chip and is calculated from a structure and materials constituting the semiconductor chip. The equation 1 represents a consumed energy according to a time function.

The consumed energy obtained from the equation 1 is applied to the following equation 2 to calculate a temperature difference generated by the consumed energy.

$$\Delta T_{TOP}(t) = P_{upper}(t) \times \left\{R_{AM-TOP} \times \left(1 - \exp\left(-\frac{t}{\tau_{die}}\right)\right)\right\} \quad \text{[Equation 2]}$$

The equation 2 is an equation calculating a temperature variation $\Delta T_{TOP}$ of a top surface of the semiconductor device. A temperature variation of a bottom surface of the semiconductor device may be calculated by the same method as the temperature variation $\Delta T_{TOP}$ of a top surface of the semiconductor device. In the equation 2, "$P_{upper}$" denotes the energy consumed from the intermediate portion to the upper portion of the semiconductor package 10, and "$R_{AM-TOP}$" denotes a thermal resistance between the top surface of the semiconductor device and ambient environment. In the equation 2, "$\tau_{die}$" denotes a torque in the semiconductor chip and is calculated from a structure and materials constituting the semiconductor chip. The equation 2 represents the temperature variation $\Delta T_{TOP}$ of a top surface of the semiconductor device according to a time function.

The temperature variation of the semiconductor device obtained from the equation 2 is applied to the following equation 3 to estimate temperatures of the top surface and the bottom surface of the semiconductor device.

$$T_{TOP} = T_{AM\_TOP} + \Delta T_{TOP}(t) \quad \text{[Equation 3]}$$

The equation 3 is an equation calculating the temperature $T_{TOP}$ of the top surface of the semiconductor device. The temperature of the bottom surface of the semiconductor device may be estimated by the same method as the temperature $T_{TOP}$ of the top surface of the semiconductor device. In the equation 3, "$T_{TOP}$" denotes the temperature of the top surface of the semiconductor device and "$T_{AM\_TOP}$" denotes an ambient temperature. The equation 3 represents the temperature of the top surface of the semiconductor device according to a time function.

Generally, one temperature sensor may be disposed in an intermediate spot of a semiconductor package included in a smart phone or a tablet personal computer (tablet PC). If a temperature sensed from the one temperature sensor is higher than 70° C., the smart phone or the tablet PC may automatically perform an operation of reducing its power consumption.

On the contrary, according to the exemplary embodiments of the inventive concept, the first, second and third temperature sensors may be disposed in the lower portion, the intermediate portion and the upper portion of the semiconductor package 10, respectively, to sense the temperatures of the spots of the lower portion, the intermediate portion, and the upper portion, respectively. Thus, the temperature of the semiconductor package 10 may be more reliably measured. Additionally, it is possible to estimate the surface temperature of the semiconductor device (e.g., a smart phone or a tablet PC) including the semiconductor package 10.

According to the exemplary embodiments of the inventive concept, the temperature of the semiconductor package may be more reliably sensed by the first to third temperature sensors. Additionally, the energy consumptions may be obtained using the temperatures sensed by the first to third temperature sensors and the thermal resistances of the semiconductor package, and then the surface temperature of the semiconductor device may be estimated using the obtained energy consumptions.

While the inventive concept has been described with reference to the exemplary embodiments, it will be apparent to those skilled in the art that various changes and modifications may be made without departing from the spirit and scope of the inventive concept. Therefore, it should be understood that the above exemplary embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of estimating a surface temperature of a semiconductor device including a semiconductor package, the method comprising:

measuring temperatures of a lower portion, an intermediate portion and an upper portion of the semiconductor package by first, second and third temperature sensors respectively connected to the lower, intermediate and the upper portions of the semiconductor package;

determining a first thermal resistance of a portion of the semiconductor package between the first and second temperature sensors and a second thermal resistance of a portion of the semiconductor package between the second and third temperature sensors;

determining first energy consumed from the intermediate portion to the upper portion of the semiconductor package and second energy consumed from the intermediate portion to the lower portion of the semiconductor package using the measured temperatures and the determined first and second thermal resistances;

estimating temperatures of a top surface and a bottom surface of the semiconductor device using the determined first and second energies; and operating the semiconductor device when the estimated temperatures of the top surface and the bottom surface of the semiconductor device exist in a predetermined temperature range.

2. The method of claim 1, wherein the first and second thermal resistances of the semiconductor packages are values obtained from a structure and materials constituting the semiconductor package.

3. The method of claim 1, wherein the semiconductor device further comprises a housing surrounding the semiconductor package, and wherein the estimating the temperatures of the top surface and the bottom surface of the semiconductor device comprises determining a first combined thermal resistance between the second temperature sensor and a top surface of an upper portion of the housing and a second combined thermal resistance between the second temperature sensor and a bottom surface of a lower upper portion of the housing.

4. The method of claim 3, wherein the first and second combined thermal resistances of the semiconductor device are values obtained by structures and materials constituting the semiconductor device between the second temperature sensor and the top surface of the upper portion of the housing and between the second temperature sensor and the bottom surface of the lower portion of the housing.

5. The method of claim 3, further comprising measuring a temperature of an outside of the semiconductor device and an outside thermal resistance between the housing and the outside, wherein the temperatures of the top surface and the bottom surface of the semiconductor device are measured further using the measured outside temperature and outside thermal resistance.

6. The method of claim 3, wherein the first combined thermal resistance is determined using the first thermal resistance and a resistance of the upper portion of the housing, and the second combined thermal resistance is determined using the second thermal resistance and a resistance of the lower portion of the housing.

7. The method of claim 6, wherein the first and second energies are determined further using the first and second combined thermal resistances and a torque in a semiconductor chip included in the semiconductor package.

8. The method of claim 7, further comprising measuring a temperature of an outside of the semiconductor device and an outside thermal resistance between the housing and the outside, wherein the temperatures of the top surface and the bottom surface of the semiconductor device are measured further using the measured outside temperature and outside thermal resistance.

9. The method of claim 1, further comprising measuring a temperature of an outside of the semiconductor device and an outside thermal resistance between the first or third temperature sensor and the outside, wherein the temperatures of the top surface and the bottom surface of the semiconductor device are measured further using the measured outside temperature and outside thermal resistance.

10. A method of estimating a surface temperature of a semiconductor device including a semiconductor package, the method comprising:

measuring temperatures of a plurality of portions of the semiconductor package separated from one another in a vertical direction of the semiconductor package;

determining thermal resistances between the plurality of portions;

determining energy consumed between the plurality of portions based on the measured temperatures and the determined thermal resistances;

estimating a temperature of at least one of a top surface and a bottom surface of the semiconductor device using the determined energy; and operating the semiconductor device when the estimated temperature of at least one of the top surface and the bottom surface of the semiconductor device exist in a predetermined temperature range.

11. The method of claim 10, wherein the temperatures are measured by a plurality of sensors disposed at the plurality of portions, respectively, and wherein each of the sensors comprises a resister or a thermistor.

12. The method of claim 10, wherein at least one of the determined thermal resistances is a value obtained from a structure and materials constituting the semiconductor package.

13. The method of claim 10, wherein the semiconductor device further comprises a housing surrounding the semiconductor package, and wherein the estimating the temperature of the at least one of the top surface and the bottom surface of the semiconductor device determining at least one of a first combined thermal resistance between a portion inside of the semiconductor package and a top surface of an upper portion of the housing and a second combined thermal resistance between the inside portion and a bottom surface of a lower upper portion of the housing.

14. The method of claim 13, further comprising measuring a temperature of an outside of the semiconductor device and an outside thermal resistance between the housing and the outside, wherein the temperatures of the at least one of the top surface and the bottom surface of the semiconductor device is measured further using the measured outside temperature and outside thermal resistance.

* * * * *